(12) United States Patent
Kwak

(10) Patent No.: US 7,817,491 B2
(45) Date of Patent: Oct. 19, 2010

(54) BANK CONTROL DEVICE AND SEMICONDUCTOR DEVICE INCLUDING THE SAME

(75) Inventor: Seung-Wook Kwak, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 154 days.

(21) Appl. No.: 12/165,127

(22) Filed: Jun. 30, 2008

(65) Prior Publication Data

US 2009/0086550 A1    Apr. 2, 2009

(30) Foreign Application Priority Data

Sep. 28, 2007   (KR) .................. 10-2007-0098223
Apr. 30, 2008   (KR) .................. 10-2008-0040928

(51) Int. Cl.
*G11C 8/00*    (2006.01)

(52) U.S. Cl. ..................... 365/230.02; 365/189.02; 365/230.06

(58) Field of Classification Search ............ 365/230.03, 365/230.06, 189.07, 189.04, 189.02, 230.02
See application file for complete search history.

(56) References Cited

U.S. PATENT DOCUMENTS 6,603,683 B2 *   8/2003  Hsu et al. ............. 365/189.04
7,499,367 B2 *   3/2009  Park ..................... 365/230.06
7,630,271 B2 *  12/2009  Kim et al. ............. 365/230.03

FOREIGN PATENT DOCUMENTS

| JP | 11-144464 | 5/1999 |
|---|---|---|
| KR | 100188021 B1 | 1/1999 |
| KR | 10-2002-0083585 A | 11/2002 |
| KR | 1020040105007 A | 12/2004 |

OTHER PUBLICATIONS

Notice of Preliminary Rejection issued from Korean Intellectual Property Office on Oct. 23, 2009.
Notice of Preliminary Rejection issued from Chinese Intellectual Property Office on Feb. 5, 2010.
Notice of Allowance issued from Korean Intellectual Property Office on Jul. 20, 2010.

* cited by examiner

*Primary Examiner*—Richard Elms
*Assistant Examiner*—Hien N Nguyen
(74) *Attorney, Agent, or Firm*—IP & T Law Firm PLC

(57) ABSTRACT

A semiconductor memory device includes a plurality of banks a plurality of banks stacked in a column direction, a global data line corresponding to the plurality of banks and a common global data line driving unit for multiplexing data on a plurality of local data lines corresponding to each of the banks to transmit the multiplexed result to the global data line.

8 Claims, 8 Drawing Sheets

FIG. 2A [PRIOR ART]
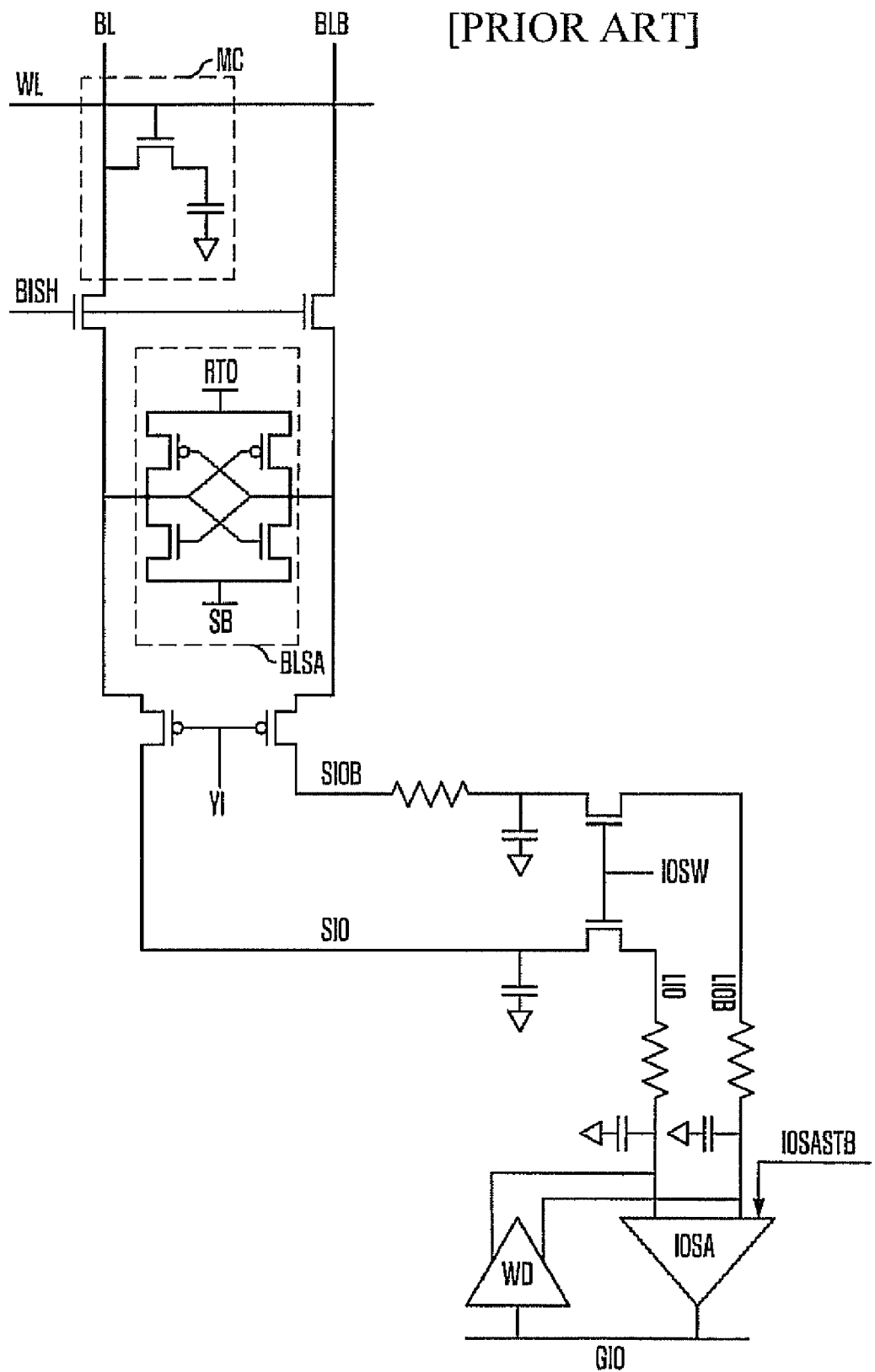

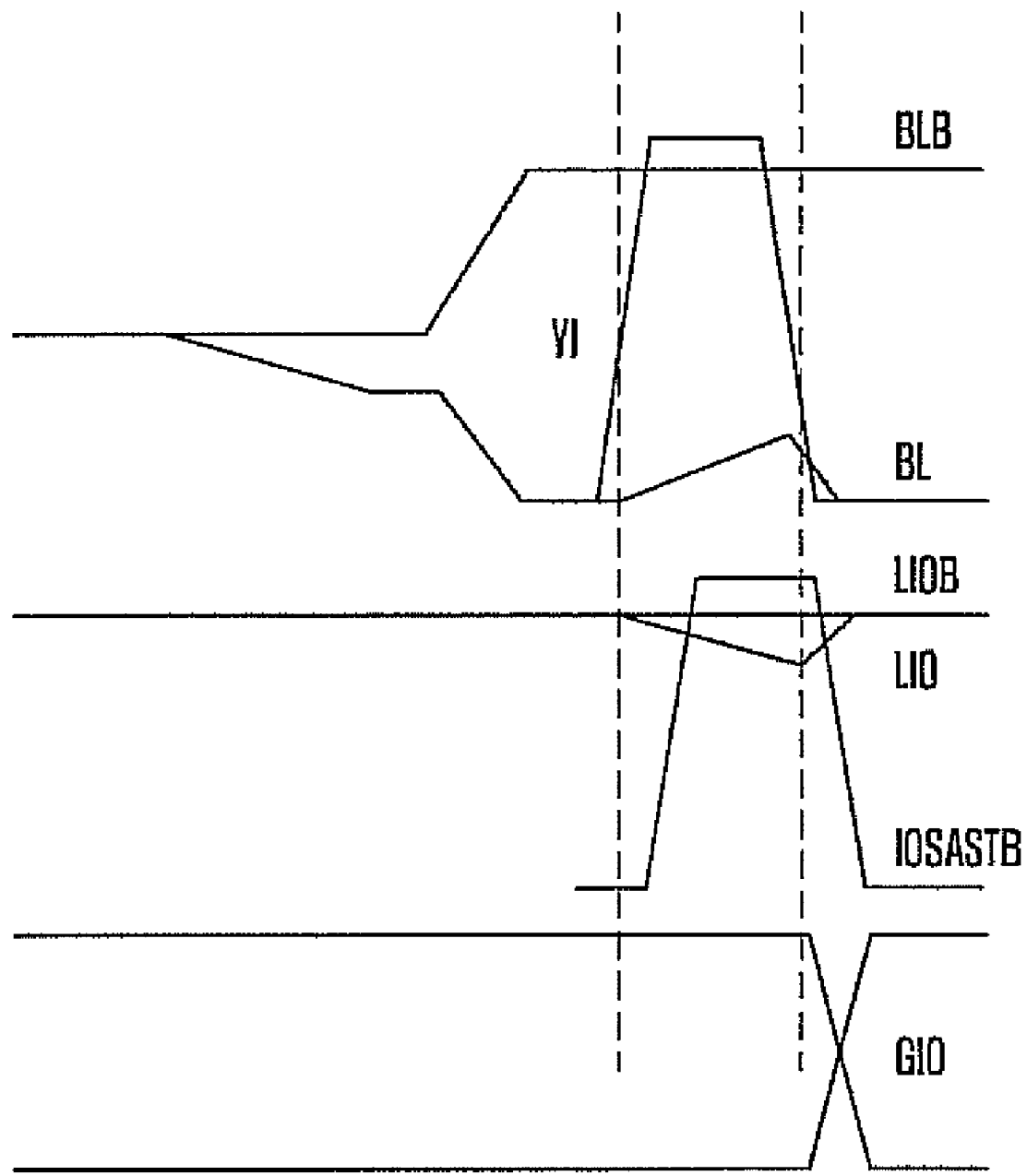

FIG. 3A
[PRIOR ART]
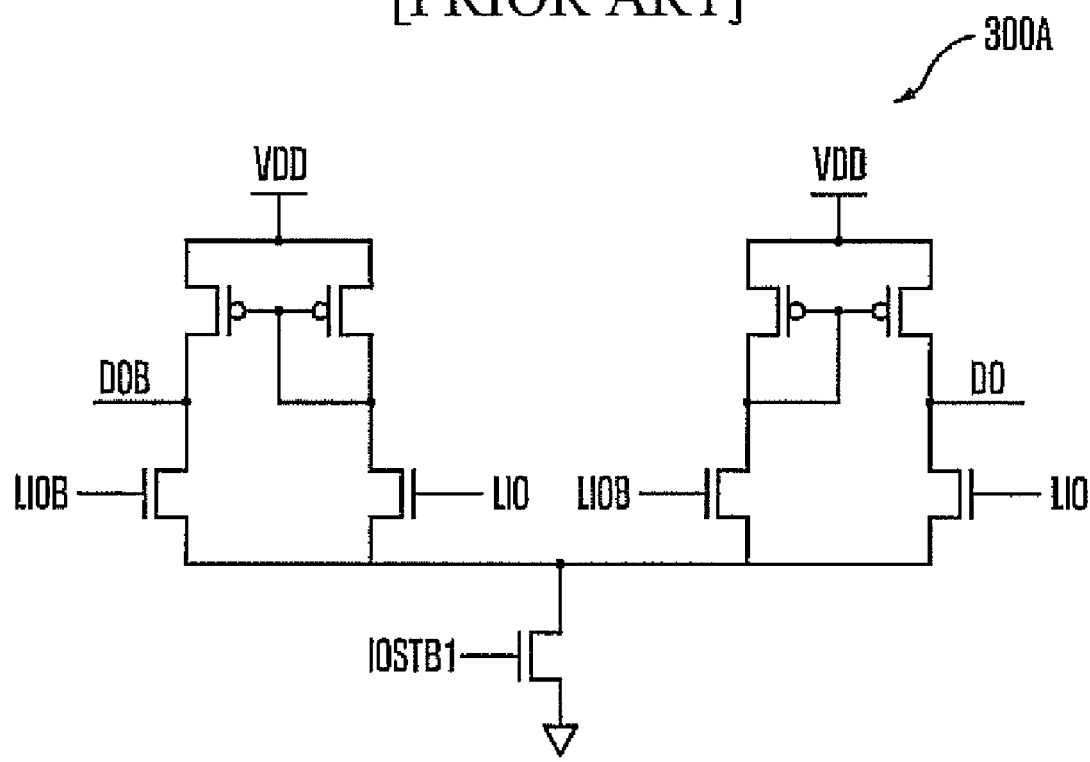
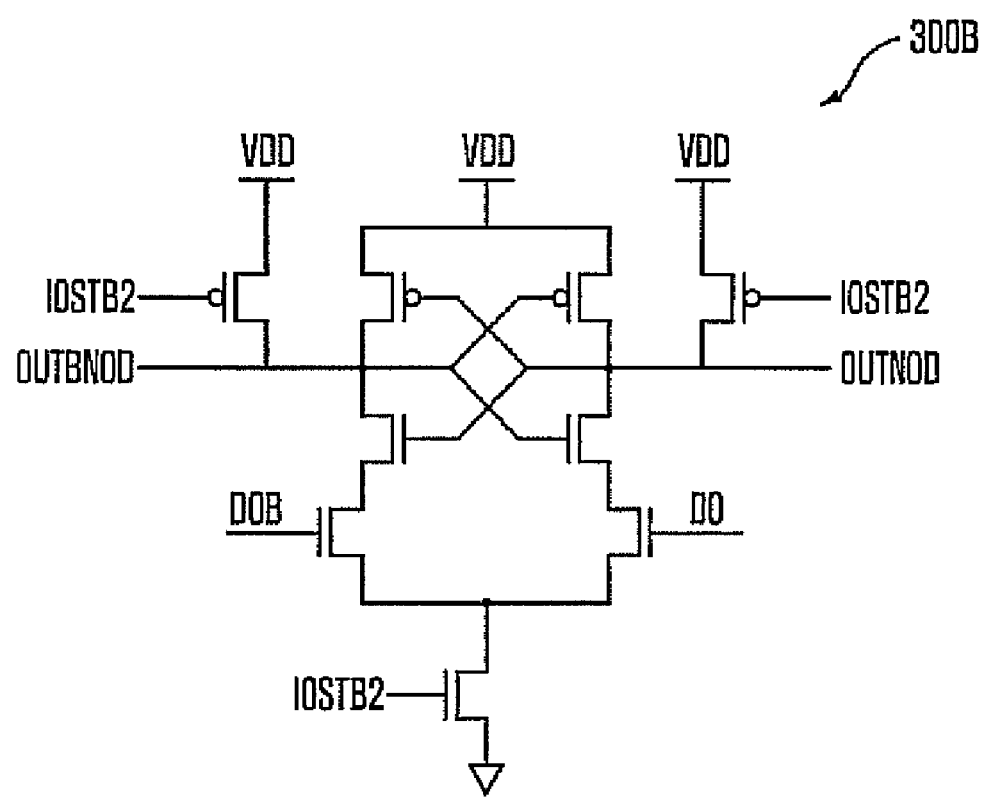

BANK CONTROL DEVICE AND SEMICONDUCTOR DEVICE INCLUDING THE SAME

CROSS-REFERENCE TO RELATED APPLICATION

The invention claims priority of Korean patent application numbers 2007-0098223 and 2008-0040928, filed on Sep. 28, 2007 and Apr. 30, 2008, respectively, which are incorporated by reference in their entirety.

BACKGROUND OF THE INVENTION

The invention relates to a method for fabricating a semiconductor memory device, and more particularly, to a method for fabricating a column control block of the semiconductor memory device.

Most semiconductor memory devices such as Dynamic Random Access Memory (DRAM) devices employ a hierarchical data bus structure. That is, a local data bus is arranged in a bank region and a global data bus is arranged in a peripheral region. The local data bus itself may be hierarchically disposed.

FIG. 1 illustrates a data bus structure of a DRAM device.

Referring to FIG. 1, a bank includes a plurality of cell arrays formed in a matrix shape. First to fourth segment data buses SIO<0>, SIO<1>, SIO<2>, and SIO<3> are arranged in a row direction in the cell array. First to sixteenth local data buses LIO 0 to LIO 15 are arranged in a column direction perpendicular to the first to fourth segment data buses SIO<0>, SIO<1>, SIO<2>, and SIO<3>. Generally, the first to fourth segment data buses SIO<0>, SIO<1>, SIO<2>, and SIO<3> and the first to sixteenth local data buses LIO 0 to LIO 15 are embodied in differential lines.

Although not shown in this figure, first to sixteenth global data buses GIO 0 to GIO 15 are arranged in a row direction in the peripheral region under the bank. A column control block is arranged between the memory cell array and the first to sixteenth global data buses GIO 0 to GIO 15. The column control block includes a write driver WD and a data bus sensing amplifier IOSA.

FIG. 2A illustrates a data transmission path for a read operation of the DRAM device.

Referring to FIG. 2A, when the DRAM device performs the read operation, the data transmission path has a memory cell MC, first and second bit lines BL and BLB, a bit line sensing amplifier BLSA, first and second segment data buses SIO and SIOB, first and second local data buses LIO and LIOB, a data bus sensing amplifier IOSA, and a global data bus GIO therein.

Herein, two NMOS transistors controlled by a bit line separation signal BISH are disposed between the first to second bit lines BL and BLB and the bit line sensing amplifier BLSA. Two PMOS transistors controlled by a column selection signal YI is disposed between the first to second segment data buses SIO, SIOB and the first to second local data buses LIO, LIOB. Two NMOS transistors controlled by an input/output switch control signal IOSW are disposed between the first to second segment data buses SIO, SIOB and the first to second local data buses LIO, LIOB.

FIG. 2B is an operation wave diagram of the circuit in FIG. 2A. Hereinafter, the read operation of the DRAM device is described referring to FIG. 2B.

When an active command is applied, a row address simultaneously applied with the active command is decoded to select a word line WL. Thus, the world line WL is activated. Accordingly, cell transistors in the memory cell MC connected to the activated word line WL are turned on. A cell capacitor, and first and second bit lines BL, BLB share charge. The first bit line BL and the second bit line BLB have a voltage difference due to the charge sharing.

The bit line sensing amplifier BLSA is enabled to sense the voltage difference between the first bit line BL and the second bit line BLB. Then, the bit line sensing amplifier BLSA amplifies the voltage difference up to pull-down power SB and pull-up power RTO levels. In FIG. 2B, the first bit line BL is amplified to a ground voltage ASS level and the second bit line BLB is amplified to a core voltage VCORE level.

Meanwhile, a read command is applied after a certain period of time tRCD from the active command application. A column address simultaneously applied with the read command is decoded to select one bit line. That is, the column selection signal YI corresponding to the selected bit line is activated. Two PMOS transistors controlled by the column selection signal YI are turned on. Thus, the first to second bit lines BL, BLB and the first to second segment data buses SIO, SIOB are connected to each other. As a result, the data on the first and second segment data buses SIO and SIOB are transmitted to the first and the second local data buses LIO and LIOB.

The input/output switch control signal IOSW is activated and the two NMOS transistors controlled by the input/output switch control signal IOSW are turned on. Thus, the data on the first and the second segment data buses SIO and SIOB is transmitted to the first and the second local data buses LIO and LIB.

Also, when a strobe signal IOSASTB generated by the read command is activated, the data bus sensing amplifier IOSA is enabled. Thus, the data bus sensing amplifier IOSA is enabled to sense and then amplify the data on the first and the second local data buses LIO and LIOB. The global data bus GIO is driven at a level corresponding to the sensed and amplified data.

The data amplified by the bit line sensing amplifier BLSA is re-stored in the memory cell MC before the bit line sensing amplifier BLSA is disabled. Thereafter, the first and the second bit lines BL and BLB are pre-charged.

The data bus sensing amplifier IOSA includes a sensing amplifying circuit for sensing and amplifying the data on the first and the second local data buses LIO and LIOB. The data bus sensing amplifier IOSA also includes a global data bus driving circuit for driving the global data bus GIO at a level corresponding to the sensed and amplified data.

FIG. 3A illustrates a sensing amplifying circuit disposed in the data bus sensing amplifier IOSA.

Referring to FIG. 3A, the data bus sensing amplifier IOSA includes a two-stage amplifying circuit. A first amplifying circuit 300A includes a current mirror type differential amplifier the mirrored parts of which are connected in parallel. The current mirror type differential amplifier is controlled by a first strobe signal IOSTB1. The first and the second local data buses LIO and LIOB are differential input terminals. A second amplifying circuit 300B includes a CMOS cross couple type differential amplifier. The CMOS cross couple type differential amplifier is controlled by a second strobe signal IOSTB2. The CMOS cross couple type differential amplifier receives first and second output signals D0 and D0B from the first amplifying circuit 300A.

FIG. 3B is an operation wave diagram of the sensing amplifying circuit in FIG. 3A.

When the input/output switch control signal IOSW is activated, the first and the second segment data buses SIO and SIOB are connected to the first and the second local data buses LIO and LIOB. Thus, an electric potential of the first and the second segment data buses SIO and SIOB is transmitted to the first and the second local data buses LIO and LIOB.

The first strobe signal IOSTB1 is activated after a certain period of time tA from the activation of the input/output switch control signal ISOW. The time tA is a margin time for developing the first and the second local data buses LIO and LIOB until the first amplifying circuit 300A has a sufficient voltage difference dV to sense the first and the second local data buses LIO and LIOB.

The second strobe signal IOSTB2 (or iostb2) is activated after a certain period of time tB from the activation of the first strobe signal IOSTB1. The tB is a margin time for the second amplifying circuit 300B.

The first and the second local data buses LIO and LIOB are pre-charged at a supply voltage VDD level. Likewise, first and second output terminals OUTNOD and OUTBNOD are pre-charged at the supply voltage VDD level.

FIG. 4 is a circuit diagram of a global data bus driving circuit in the data bus sensing amplifier IOSA.

Referring to FIG. 4, the global data driving circuit includes a first inverter INV1, a second inverter INV2, a third inverter INV3, a fourth inverter INV4, a fifth inverter INV5, a pull-up PMOS transistor MP1, and a pull-down NMOS transistor MN1. The first inverter INV1 receives a positive output signal OUT of the sensing amplifying circuit. The second inverter INV2 receives an output signal of the first inverter INV1. The third inverter INV3 receives a negative signal OUTB of the sensing amplifying circuit. The fourth inverter INV4 receives an output signal of the third inverter INV3. The fifth inverter INV5 receives an output signal of the fourth inverter INV4. The pull-up PMOS transistor MP1 has a source and a drain connected to the global data bus GIO and the second inverter INV2, respectively. The pull-up PMOS transistor MP1 receives an output signal of the second inverter INV2 as a gate input. The pull-down NMOS transistor NM1 has a source and a drain connected to a ground voltage terminal VSS and the global data bus GIO, respectively. The pull-down NMOS transistor NM1 receives an output signal of the fifth inverter INV5 as a gate input.

Recently, a highly integrated DRAM device employs a stack bank structure for reducing circuit dimensions by stacking more than two banks. When the stack bank structure is employed, a decoding circuit shares a plurality of banks. Thus, it is possible to reduce the entire decoding circuit dimensions.

FIG. 5 is a block diagram of a read path in a DRAM device with a stack bank structure.

Referring to FIG. 5, two banks are stacked in a column direction. That is, a second bank BANK1 is arranged over a first bank BANK0. A first local data bus LIO_UP corresponding to the second bank BANK1 is arranged to a global data bus GIO through the first bank BANK0. A second local data bus LIO_DN corresponding to the first bank BANK0 is arranged to the global data bus GIO.

First column controlling unit corresponding to the first bank BANK0 and second column controlling unit corresponding to the second bank BANK1 are arranged between the first bank BANK0 and the global data bus GIO. A write driver WD of FIG. 1 and the data bus sensing amplifier IOSA of FIG. 1 are employed in the first and the second column controlling units, respectively.

The invention relates to a data bus driving circuit in the data bus sensing amplifier IOSA. Thus, the description about the write driver WD is omitted.

In specific, the first column controlling unit includes the sensing amplifying circuit (FIG. 3A) for sensing and amplifying data on the second local data bus LIO_DN and the data bus driving circuit (FIG. 4). The second column controlling unit includes the sensing amplifying circuit for sensing and amplifying the data on the first local data bus LIO_UP and the data driving circuit.

In the typical the stack bank structure, each of the bank includes the data bus driving circuit in the column control block. Thus, dimensions of the column control block are large.

SUMMARY OF THE INVENTION

Embodiments of the invention are directed to providing a method for fabricating a column controlling block of the semiconductor memory device.

This provides a semiconductor memory device that can minimize circuit dimensions for a data bus driving circuit in a stack bank structure.

In accordance with an aspect of the invention, there is provided a semiconductor memory device including a plurality of banks stacked in a column direction, a global data line corresponding to the plurality of banks, a common global data line driving unit for multiplexing data on a plurality of local lines corresponding to each of the banks to transmit the multiplexing result to the global data line.

In accordance with another aspect of the invention, there is provided a semiconductor memory device including a first bank, a second bank arranged in a column direction with the first bank, a global data line corresponding to the first bank and the second bank, a first sensing amplifying unit for sensing and amplifying the data on the first local data bus corresponding to the first bank, a second sensing amplifying unit for sensing and amplifying the data on the second local data bus corresponding to the second bank, and a common global data line driving unit for multiplexing data outputted from the first sensing amplifying unit and the second sensing amplifying unit to transmit a multiplexing result to the global data line.

BRIEF DESCRIPTION OF THE DRAWINGS

FIG. 2A illustrates a data transmission path for a read operation of the DRAM device.

FIG. 2B is an operation wave diagram of the circuit in FIG. 2A.

FIG. 3A illustrates a sensing amplifying circuit disposed in the data bus sensing amplifier IOSA.

DESCRIPTION OF SPECIFIC EMBODIMENTS

Embodiments of the invention relate to a method for fabricating a column controlling block of the semiconductor memory device.

Figure 6:
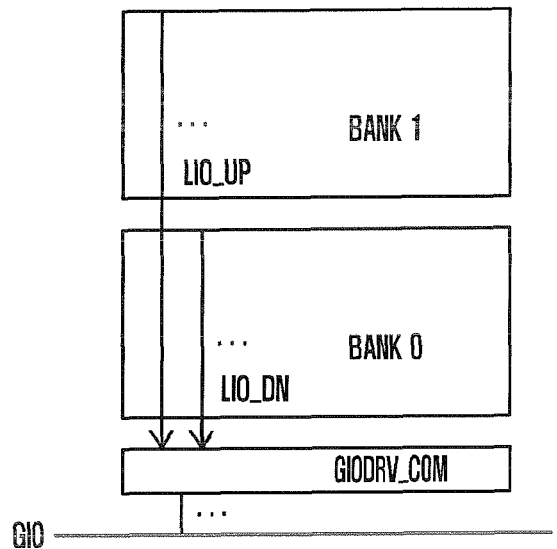
FIG. 6 is a block diagram of a read path in a DRAM device with a stack bank structure in accordance with an embodiment of the invention.

FIG. 6 is a block diagram of a read path in a DRAM device with a stack bank structure in accordance with an embodiment of the invention.

Referring to FIG. 6, the DRAM device in this embodiment includes first and second banks BANK0 and BANK1 stacked in a column direction, a global data bus GIO corresponding to the stacked first and second banks BANK0 and BANK1, and a common global data bus driving unit GIODRV_COM for multiplexing data on the first to second local data buses LIO_DN and LIO_UP respectively corresponding to the first and the second banks BANK0 and BANK1 and transmitting the multiplexing result to the global data bus GIO.

In FIG. 6, the second bank BANK1 is arranged over the first bank BANK0. That is, a two-bank BANK0 stack structure is embodied. However, more than four banks can be stacked. The second local data bus LIO_UP corresponding to the second bank BANK1 is arranged to the common data bus driving unit through the first bank BANK1. The first local data bus LIO_UP corresponding to the first bank BANK0 is arranged to the common data bus driving unit.

That is, in this embodiment, the data bus driving circuit of the prior art is not allotted to each bank. Stacked banks share the data bus driving circuit.

Figure 7:
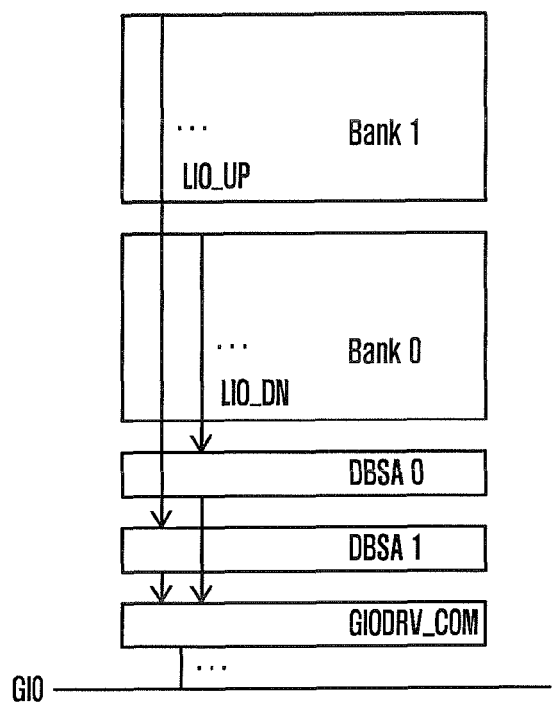
FIG. 7 is a block diagram of a read path in the DRAM device.

FIG. 7 is a block diagram of a read path in the DRAM device

Referring to FIG. 7, the DRAM device includes a first bank BANK0, a second bank BANK1 stacked in a column direction with the first bank BANK0, a global data bus GIO corresponding to the first and the second banks BANK0 and BANK1, a first sense amplifying circuit DBSA O for sensing and amplifying the data on the first local data bus LIO_DN corresponding to the first bank BANK0, a second sense amplifying circuit DBSA 1 for sensing and amplifying the data on the second local data bus LIO_UP corresponding to the second bank BANK1, and a common global data bus driving unit GIODRV_COM for multiplexing the data from the first and the second sense amplifying circuits DBSA 0 and DBSA 1 and transmitting the multiplexing result to the global data bus GIO.

Figure 1:
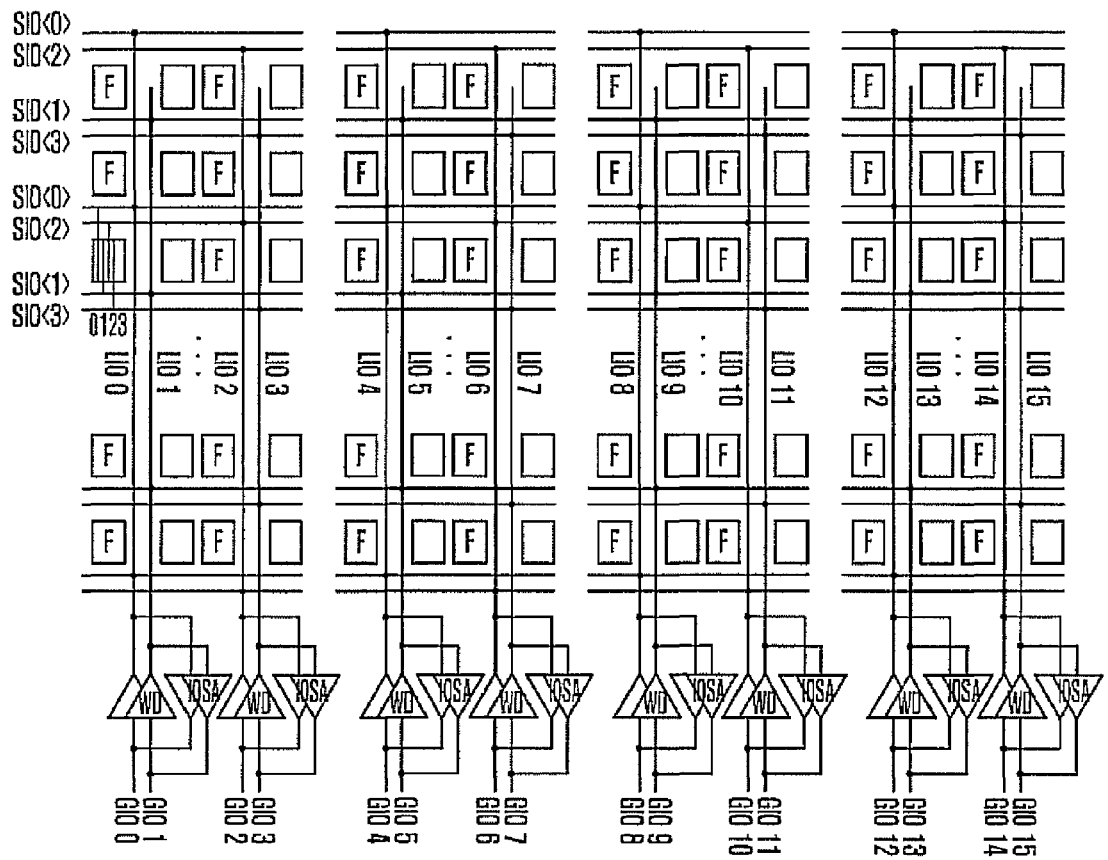
FIG. 1 illustrates a data bus structure of a DRAM device.
Figure 3B:
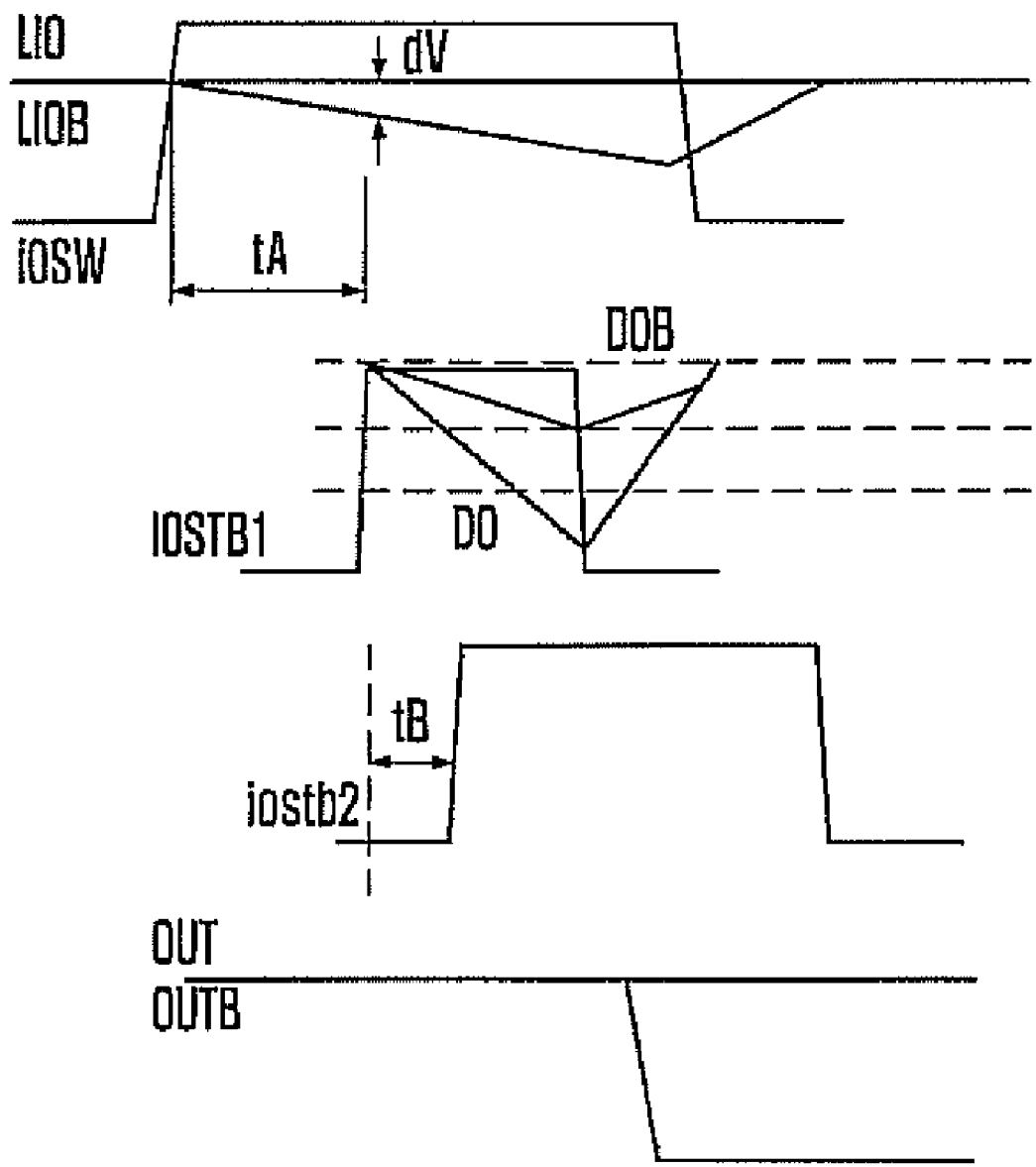
FIG. 3B is an operation wave diagram of the sensing amplifying circuit in FIG. 3A.
Figure 4:
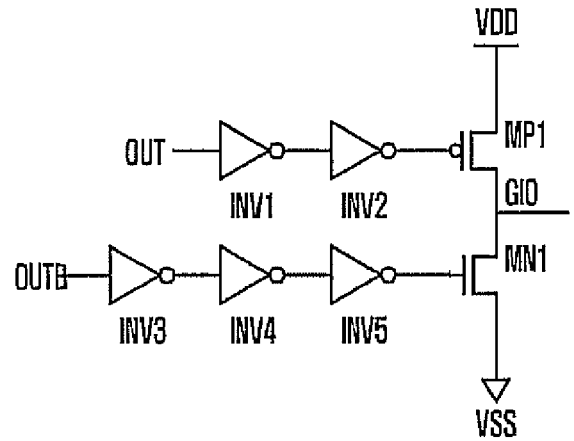
FIG. 4 is a circuit diagram of a global data bus driving circuit in the data bus sensing amplifier IOSA.
Figure 5:
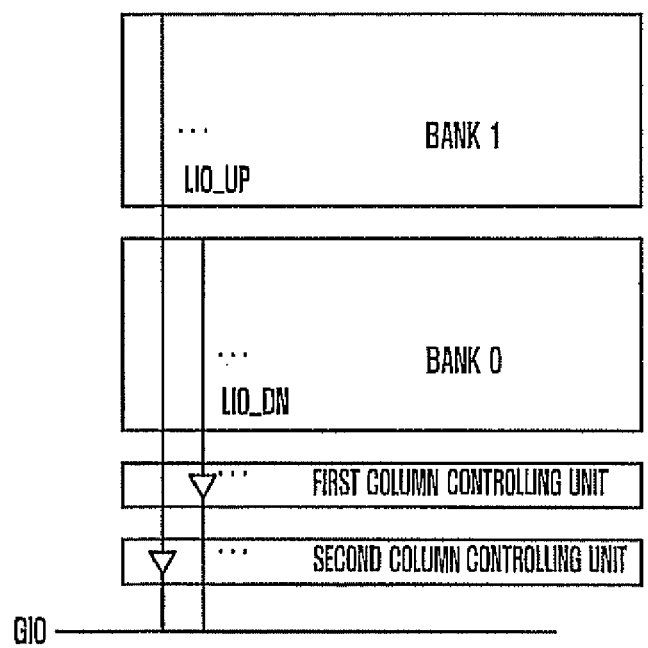
FIG. 5 is a block diagram of a read path in a DRAM device with a stack bank structure.

In comparison with the typical method illustrated in FIG. 5, structures of the first and the second sense amplifying circuits DBSA 0 and DBSA 1 are same as those of the data bus sensing amplifier of FIG. 3A.

However, the data bus sensing amplifier of FIG. 3A is not allotted to each bank. The first and the second banks BANK0 and BANK1 share one data bus sensing amplifier of FIG. 3A. That is, it is possible to save circuit dimensions for one data bus sensing amplifier of FIG. 3A.

Figure 8:
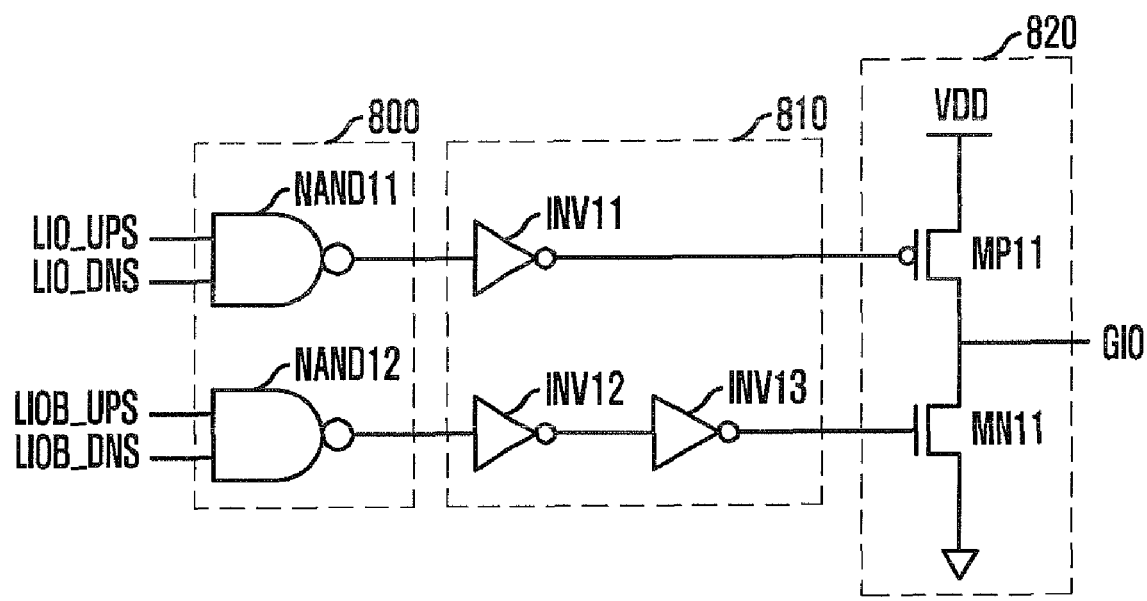
FIG. 8 is a circuit diagram of the common data bus driving unit GIODRV_COM in FIG. 7.

FIG. 8 is a circuit diagram of the common data bus driving unit GIODRV_COM in FIG. 7.

Referring to FIG. 8, the common data bus driving unit GIODRV_COM includes a multiplexing unit 800, a buffering unit 810, and an output driving unit 820. The multiplexing unit 800 multiplexes and outputs first positive and negative output signals LIO_DNS and LIOB_DNS from the first sense amplifying circuit DBSA 0 and second positive and negative signals LIO_UPS and LIOB_UPS from the second sense amplifying circuit DBSA 1. The buffering unit 810 buffers an output of the multiplexing unit 800. The output driving unit 820 responses to an output signal of the buffering unit 810 to up/down drive the global data bus GIO.

The multiplexing unit 800 includes a first NAND gate NAND11 and a second NAND gate NAND12. The first NAND gate NAND 11 receives the second positive signal LIO_UPS of the second sense amplifying circuit DBSA 1 and the first negative output signal LIO_DNS of the first senses amplifying circuit DBSA 0. The second NAND gate NAND12 receives the negative output signal LIOB_DNS of the first sense amplifying circuit DBSA 0 and the second negative signal LIOB_UPS of the second sense amplifying circuit DBSA 1.

The buffering unit 810 includes first to third inverters INV11, INV12, and INV13. The first inverter INV11 receives an output signal of the first NAND gate NAND11. The second inverter INV12 receives an output signal of the second NAND gate NAND12. The third inverter INV13 receives an output signal of the third inverter INV13.

The output driving unit 820 includes a pull-up PMOS transistor MP11 and a pull-down NMOS transistor MN11. The pull-up PMOS transistor MP11 has a source and a drain respectively connected to a supply voltage VDD terminal and a global data bus GIO, and receives an output signal of the first inverter INV11. The pull-down NMOS transistor MN11 has a source and a drain respectively connected to the ground voltage VSS terminal and the global data bus GIO, and receives an output signal of the third inverter INV13.

Hereinafter, the read operation in the DRAM device in accordance with an embodiment of the invention is briefly described.

When an active command is applied and a word line of the first bank BANK0 is activated, the data is transmitted to a bit line, a segment data bus, and a first local data bus LIO_DN by a subsequent read command. The data on the first local data bus LIO_DN is sensed and amplified by the first sense amplifying circuit DBSA 0. Accordingly, the first positive and negative output signals LIO_DNS and LIOB_DNS have a level corresponding to the sensed and amplified data.

The second local data bus LIO_UP of the second bank BANK1 corresponding to the first local data bus LIO_DN is pre-charged at the supply voltage VDD level. That is, the second positive and negative signals LIO_UPS and LIOB_UPS of the second sense amplifying circuit DBSA 1 are fixed as a high level.

Accordingly, the first NAND gate NAND11 in the multiplexing unit 800 inverts and outputs the first positive signal LIO_DNS of the first sense amplifying circuit DBSA 0. The second NAND gate NAND12 inverts and outputs the first negative output signal LIOB_DNS of the first sense amplifying circuit DBSA 0. That is, an output signal of the first sense amplifying circuit DBSA 0 is selectively outputted. The output driving unit 820 drives the global data bus GIO at a level corresponding to the output signal.

On the contrary, when the second bank BANK1 is activated, the multiplexing unit 800 selectively outputs an output signal of the second sense amplifying circuit DBSA 1.

In this invention, the data bus driving circuit is shared, and thus column control block dimensions are greatly reduced. As a result, a net die yield increases.

While the invention has been described with respect to the specific embodiments, the above embodiments of the invention are illustrative and not limitative. It will be apparent to those skilled in the art that various changes and modifications may be made without departing from the spirit and scope of the as defined in the following claims.

For instance, in this embodiment, two banks are stacked. However, the invention can be applied to a bank structure including banks of even numbers more than four.

Also, in this embodiment, the multiplexing unit includes two NAND gates. However, the multiplexing unit can be embodied by other methods.

Furthermore, this is applied to the DRAM device as an example. However, this can be also applied to other semiconductor memory devices with a stack bank structure and a hierarchal data bus structure.

What is claimed is:

1. A semiconductor memory device, comprising:
   a plurality of banks stacked in a column direction;
   a global data line corresponding to the plurality of banks; and
   a common global data line driving unit configured to multiplex data outputted from the plurality of banks through a plurality of local data lines corresponding to the plurality of the banks, respectively, and to transmit a multiplexed result thereof to the global data line.

2. The semiconductor memory device of claim 1, wherein each of the plurality of local data lines includes a positive data line and a negative data line, the positive data line and the negative data line being pre-charged substantially to a supply voltage level during a period that data is not transmitted through the positive and negative data lines.

3. A semiconductor memory device, comprising:
   a first bank;
   a second bank arranged in a column direction with the first bank;
   a global data line corresponding to the first bank and the second bank;
   a first sense amplifying unit configured to sense and amplify data outputted from the first bank through a first local data bus corresponding to the first bank;
   a second sense amplifying unit configured to sense and amplify data outputted from the second bank through a second local data bus corresponding to the second bank; and
   a common global data line driving unit configured to multiplex data outputted from the first sense amplifying unit and the second sense amplifying unit and to transmit a multiplexed result thereof to the global data line,
   wherein the common global data line driving unit is shared by the first sense amplifying unit and the second sense amplifying unit in outputting the respective amplified data of the first and second sense amplifying units.

4. The semiconductor memory device of claim 3, wherein the common global data line driving unit includes:
   a multiplexing unit configured to multiplex a positive/negative output signal of the first sense amplifying unit and a positive/negative output signal of the second sense amplifying unit and then output the multiplexed result as an output signal of the multiplexing unit;
   a buffering unit configured to buffer the output signal of the multiplexing unit; and
   an output driving unit configured to pull-up/down drive the global data line in response to an output signal of the buffering unit.

5. The semiconductor memory device of claim 4, wherein the multiplexing unit includes a first NAND gate configured to receive a positive output signal of the first sense amplifying unit and to receive a positive signal of the second sense amplifying output signal, and a second NAND gate configured to receive a negative output signal of the first sense amplifying unit and to receive a negative output signal of the second sense amplifying unit.

6. The semiconductor memory device of claim 5, wherein the buffering unit includes:
   a first inverter configured to receive an output signal of the first NAND gate;
   a second inverter configured to receive an output signal of the second NAND gate; and
   a third inverter configured to receive an output signal of the second inverter.

7. The semiconductor memory device of claim 6, wherein the output driving unit includes a pull-up PMOS transistor having a source and a drain respectively connected to a supply voltage terminal and the global data line, and configured to receive an output of the first inverter as a gate input thereof, and a pull-down NMOS transistor having a source and a drain respectively connected to a ground voltage terminal and the global data line, and configured to receive an output signal of the third inverter as a gate input thereof.

8. The semiconductor memory device of claim 3, wherein the first and the second local data lines include a positive data line and a negative data line, each of which are pre-charged substantially to a supply voltage level during a period that data is not transmitted through the positive and negative data lines.

* * * * *